United States Patent
Hirano et al.

(10) Patent No.: US 9,673,139 B2
(45) Date of Patent: Jun. 6, 2017

(54) SEMICONDUCTOR DEVICE

(71) Applicant: Panasonic Intellectual Property Management Co., Ltd., Osaka (JP)

(72) Inventors: Hiroshige Hirano, Toyama (JP); Michinari Tetani, Toyama (JP); Masakazu Hamada, Toyama (JP); Nobuaki Tarumi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/160,033

(22) Filed: May 20, 2016

(65) Prior Publication Data

US 2016/0268184 A1 Sep. 15, 2016

Related U.S. Application Data

(63) Continuation of application No. PCT/JP2014/005805, filed on Nov. 19, 2014.

(30) Foreign Application Priority Data

Dec. 27, 2013 (JP) .................................. 2013-272081

(51) Int. Cl.
*H01L 23/48* (2006.01)
*H01L 23/053* (2006.01)
(Continued)

(52) U.S. Cl.
CPC ............ *H01L 23/498* (2013.01); *C25D 5/022* (2013.01); *C25D 5/12* (2013.01); *C25D 7/123* (2013.01);
(Continued)

(58) Field of Classification Search
CPC . H01L 23/498; H01L 23/49811; H01L 24/10; H01L 24/11; H01L 24/14;
(Continued)

(56) References Cited

U.S. PATENT DOCUMENTS

| 5,969,424 A | 10/1999 | Matsuki et al. |
| 2005/0269206 A1 | 12/2005 | Tanaka et al. |
| 2007/0186412 A1* | 8/2007 | Hsu ........................ H05K 1/112 29/830 |

FOREIGN PATENT DOCUMENTS

| JP | 10-261663 | 9/1998 |
| JP | 2001-053075 | 2/2001 |

(Continued)

OTHER PUBLICATIONS

International Search Report of PCT application No. PCT/JP2014/005805 dated Feb. 24, 2015.

*Primary Examiner* — Hsien Ming Lee
(74) *Attorney, Agent, or Firm* — McDermott Will & Emery LLP

(57) ABSTRACT

A semiconductor device includes a first insulating film, a first wiring, a second insulating film, and a second wiring. The first insulating film is formed on a semiconductor substrate. The first wiring is formed on the first insulating film. The second insulating film is provided on the first insulating film to cover the first wiring. The second wiring is formed on the second insulating film. Furthermore, the second insulating film has a first opening part and a second opening part which expose the first wiring. The second wiring has a seed layer and a first plating layer. The first plating layer covers an entire side surface of the seed layer. The seed layer is not provided in the second opening part and a periphery thereof.

17 Claims, 21 Drawing Sheets

(51) Int. Cl.
  *H01L 23/52* (2006.01)
  *H01L 21/44* (2006.01)
  *H01L 21/4763* (2006.01)
  *H01L 23/498* (2006.01)
  *C25D 5/12* (2006.01)
  *H01L 23/532* (2006.01)
  *C25D 7/12* (2006.01)
  *C25D 5/02* (2006.01)
  *H01L 23/00* (2006.01)
  *H01L 21/288* (2006.01)
  *H01L 21/70* (2006.01)
  *H01L 21/768* (2006.01)
  *H01L 23/492* (2006.01)

(52) U.S. Cl.
  CPC ........ *H01L 21/2885* (2013.01); *H01L 21/705* (2013.01); *H01L 21/76843* (2013.01); *H01L 21/76865* (2013.01); *H01L 21/76873* (2013.01); *H01L 21/76879* (2013.01); *H01L 21/76885* (2013.01); *H01L 23/4924* (2013.01); *H01L 23/49811* (2013.01); *H01L 23/49838* (2013.01); *H01L 23/53238* (2013.01); *H01L 23/53266* (2013.01); *H01L 24/03* (2013.01); *H01L 24/05* (2013.01); *H01L 2224/02311* (2013.01); *H01L 2224/0347* (2013.01); *H01L 2224/03462* (2013.01); *H01L 2224/03903* (2013.01); *H01L 2224/0401* (2013.01); *H01L 2224/05013* (2013.01); *H01L 2224/05024* (2013.01); *H01L 2224/05027* (2013.01); *H01L 2224/05084* (2013.01); *H01L 2224/05147* (2013.01); *H01L 2224/05155* (2013.01); *H01L 2224/05547* (2013.01); *H01L 2224/05553* (2013.01); *H01L 2224/05564* (2013.01); *H01L 2224/05644* (2013.01); *H01L 2224/1403* (2013.01); *H01L 2224/14155* (2013.01)

(58) Field of Classification Search
  CPC ... H01L 24/17; H01L 21/4846; H01L 21/485; H01L 21/4853; H01L 2021/60225; H01L 2021/60255
  USPC ................ 438/612–614, 618, 622, 637, 652; 257/690, 700, 734, 737, 750, 758, 774
  See application file for complete search history.

(56) References Cited

FOREIGN PATENT DOCUMENTS

| | | |
|---|---|---|
| JP | 2006-024902 | 1/2006 |
| JP | 2009-117637 | 5/2009 |
| JP | 2011-018832 | 1/2011 |
| JP | 2011-119460 | 6/2011 |
| JP | 2013-038302 | 2/2013 |
| JP | 2013-093360 | 5/2013 |

* cited by examiner

SEMICONDUCTOR DEVICE

RELATED APPLICATIONS

This application is a Continuation of International Application No. PCT/JP2014/005805, filed on Nov. 19, 2014, which in turn claims priority from Japanese Patent Application No. 2013-272081, filed on Dec. 27, 2013, the contents of all of which are incorporated herein by reference in their entireties.

BACKGROUND

1. Field of the Invention

The present disclosure relates to a semiconductor device.

2. Description of the Related Art

As a method for forming a wiring of a thick film on a semiconductor substrate, a semiconductor device, and the like, there is a semi-additive method. For example, a method for forming a wiring on an insulating substrate using a semi-additive method is described in Unexamined Japanese Patent Publication No. 2006-24902. In particular, a seed layer of copper is first formed on a substrate made of insulating resin. Subsequently, a resist pattern having an opening for forming a pattern is formed and electroplating is performed to form a wiring of a thick film in the opening of the resist pattern. After the wiring has been formed, the resist pattern is removed and thereafter the seed layer that remains in a region other than the wiring is removed.

Furthermore, a wiring is disclosed in Unexamined Japanese Patent Publication No. 2009-117637 in which a surface of a connection terminal formed on a semiconductor chip mounting substrate is coated with an electroless plating film, the connection terminal being formed on a surface of the substrate.

In addition, a structure is described in Unexamined Japanese Patent Publication No. 2013-93360 in which a side surface of a copper wiring is coated with nickel or gold by electroplating.

SUMMARY

An aspect of a semiconductor device of the present disclosure includes a first insulating film, a first wiring, a second insulating film, and a second wiring. The first insulating film is formed on a semiconductor substrate. The first wiring is formed on the first insulating film. The second insulating film is provided on the first insulating film to cover the first wiring. The second wiring is formed on the second insulating film. The second insulating film has a first opening part and a second opening part. The first opening part and the second opening part expose the first wiring. The second wiring has a seed layer provided in the first opening part and a periphery of the first opening part, and a first plating layer that is provided on the seed layer and covers an entire side surface of the seed layer. The seed layer is not provided in the second opening part and a periphery of the second opening part.

In an aspect of the semiconductor device, the seed layer is made of a first metal. And the first plating layer is made of a second metal whose hardness is higher than hardness of the first metal.

In this case, the first metal may be copper and the second metal may be nickel.

An aspect of the semiconductor device further includes a second plating layer provided between the seed layer and the first plating layer, wherein the first plating layer covers an upper surface and an entire side surface of the second plating layer.

In this case, the second plating layer may be a base layer of the second wiring.

In an aspect of the semiconductor device, a plurality of the first opening parts are provided, the second plating layer has a plurality of portions, which are separated from each other, each provided corresponding to a different one of the plurality of the first opening parts. The first plating layer integrally covers the plurality of portions of the second plating layer.

In this case, the plurality of portions of the second plating layer may be arranged in one row or arranged in a matrix form.

In an aspect of the semiconductor device, the first plating layer may be a base layer of the second wiring.

Furthermore, a plurality of the first opening parts are provided.

In an aspect of the semiconductor device, the first opening part may have a planar rectangular shape.

An aspect of the semiconductor device further includes a third wiring provided on the first insulating film and adjacent to the first wiring, wherein the second wiring is provided across the first wiring and the third wiring and is not connected to the third wiring.

In an aspect of the semiconductor device, the second wiring may have a third plating layer provided on the first plating layer.

In an aspect of the semiconductor device, the first wiring may have a recess part in a portion exposed through the second opening part.

In an aspect of the semiconductor device, the second wiring may be a bump pad.

In an aspect of the semiconductor device further includes a barrier layer between the seed layer and the first wiring in the first opening part.

In an aspect of the semiconductor device, a position of a side edge of the seed layer coincides with a position of a side edge of the barrier layer.

According to the semiconductor device of the present disclosure, it is possible to realize a semiconductor device including a wiring having sufficient oxidation resistance or migration resistance.

DESCRIPTION OF THE EXEMPLARY EMBODIMENTS

In a configuration of Unexamined Japanese Patent Publication No. 2006-24902, a seed layer of copper ends up being exposed through a side surface of a wiring. Therefore, there is a possibility that short circuit of a wiring occurs, for example, due to degradation caused by oxidation of copper or due to migration of copper.

In a configuration of Unexamined Japanese Patent Publication No. 2009-117637, an entire surface including a side surface of a connection terminal can be coated with an electroless plating film. However, electroless plating has problems that electroless plating has difficulty in controllability of plating in comparison with electroplating and that an insulating film in addition to a wiring is also plated. Furthermore, there is also a problem from a viewpoint of productivity that a plating speed of electroless plating is generally slow.

In a configuration of Unexamined Japanese Patent Publication No. 2013-93360, it is necessary to connect an electrical current supply source and a seed layer in order to perform electroplating. Therefore, after a film has been formed, an unnecessary wiring and seed layer are to be removed. Accordingly, a structure is formed in which a portion of a wiring is necessarily exposed through a film. As a result, there is a possibility that a wiring is short-circuited due to degradation caused by oxidation or due to migration in the exposed portion of copper.

The present disclosure makes it possible to realize a semiconductor device including a wiring having sufficient oxidation resistance or migration resistance.

First Exemplary Embodiment

Figure 1A:
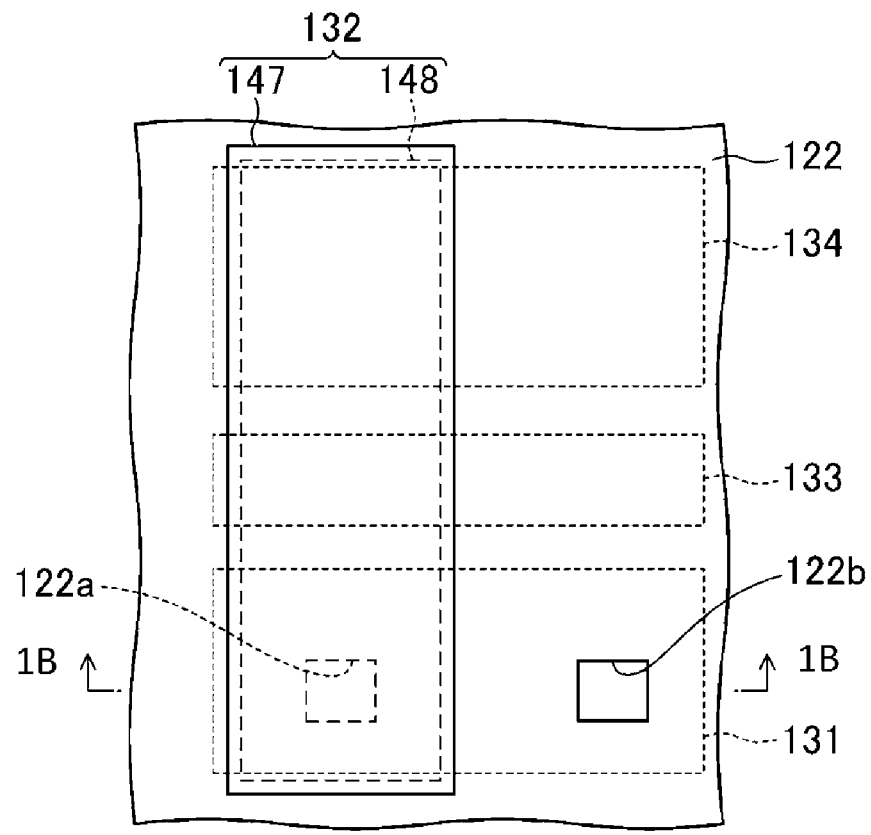
FIG. 1A is a plan view illustrating a semiconductor device according to a first exemplary embodiment.
Figure 1B:
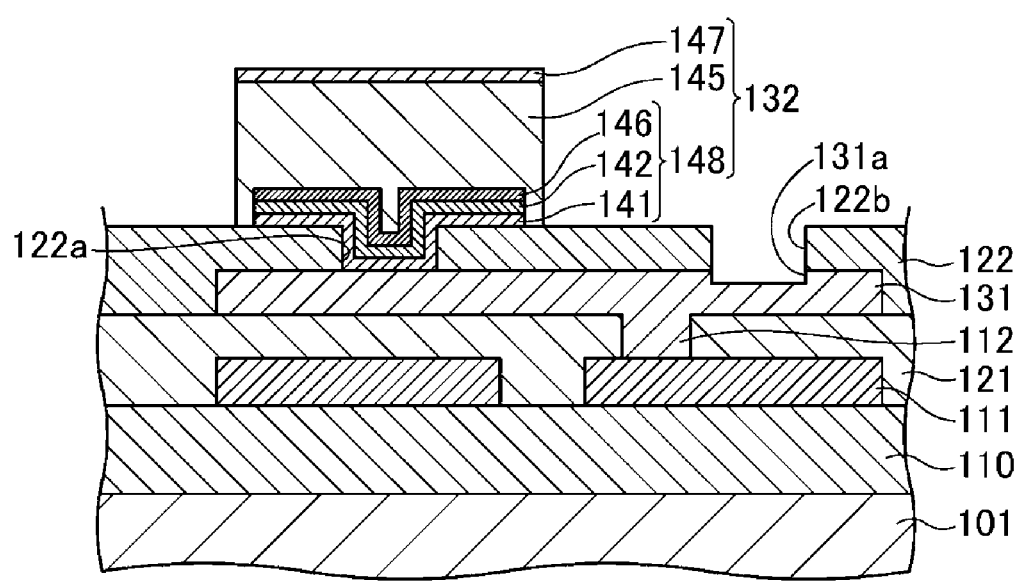
FIG. 1B is a cross-sectional view taken along line 1B-1B of the semiconductor device illustrated in FIG. 1A.

As illustrated in FIG. 1A and FIG. 1B, in a semiconductor device according to a first exemplary embodiment, first insulating film 121 is provided on underlayer 110 that is provided on semiconductor substrate 101. First wiring 131 is provided on first insulating film 121. Second insulating film 122 is provided on first insulating film 121 to cover first wiring 131. Second insulating film 122 has first opening part 122a and second opening part 122b. First opening part 122a and second opening part 122b expose an upper surface of first wiring 131. Second wiring 132 is provided on second insulating film 122. Second wiring 132 is provided in first opening part 122a and a periphery of first opening part 122a but not provided in second opening part 122b and a periphery of second opening part 122b. Second wiring 132 is connected to first wiring 131 through first opening part 122a but not connected to first wiring 131 through second opening part 122b.

Second wiring 132 has barrier layer 141, seed layer 142 provided on and in contact with barrier layer 141, and an electroplating layer provided on and in contact with seed layer 142. Barrier layer 141 is in contact with a portion of an upper surface of second insulating film 122 in a periphery of first opening part 122a, a side surface of first opening part 122a, and a portion of an upper surface of first wiring 131, the portion being exposed through first opening part 122a. The electroplating layer has first plating layer 145, second plating layer 146 provided between first plating layer 145 and seed layer 142, and third plating layer 147 provided on first plating layer 145. Second plating layer 146 is in contact with seed layer 142.

In a plan view, barrier layer 141, seed layer 142, and plating layer 146 are approximately the same size. Accordingly, positions of side ends of barrier layer 141, seed layer 142, and plating layer 146 are approximately the same. In the following, barrier layer 141, seed layer 142, and plating layer 146 are collectively referred to as lower region 148. A side surface of lower region 148 is approximately perpendicular to a principal surface of semiconductor substrate 101.

In a plan view, first plating layer 145 is larger than lower region 148 and extends outside lower region 148. Accordingly, first plating layer 145 covers an upper surface and a side surface of lower region 148. And a lower surface of first plating layer 145 is in contact with an upper surface of second insulating film 122 outside lower region 148. Therefore, lower region 148 is shielded from outside by first wiring 131, second insulating film 122, and first plating layer 145.

Lower region 148 does not completely fill first opening part 122a. Thus, there is a recess part in an upper surface of lower region 148 at a position corresponding to first opening part 122a. First plating layer 145 is provided to fill the recess part of lower region 148. First plating layer 145 is sufficiently thick, and an upper surface of first plating layer 145 is flat. An upper surface of third plating layer 147 provided on first plating layer 145 is also flat. First plating layer 145 and third plating layer 147 are approximately the same size in a plan view and positions of side ends of first plating layer 145 and third plating layer 147 are approximately the same.

Barrier layer 141 is made of, for example, titanium. A thickness of barrier layer 141 is, for example, approximately 0.2 μm. Seed layer 142 is made of, for example, copper. A thickness of seed layer 142 is, for example, approximately 0.2 μm. First plating layer 145 is made of, for example, nickel. A thickness of first plating layer 145 is, for example, approximately 10 μm. Second plating layer 146 is made of, for example, copper. A thickness of second plating layer 146 is, for example, approximately 0.4 μm. Third plating layer 147 is made of, for example, gold. A thickness of third plating layer 147 is, for example, approximately 0.3 μm. First plating layer 145 is a base layer, which is a layer having a largest mass among metal layers constituting second wiring 132.

Second wiring 132 is not provided in second opening part 122b and in a periphery of second opening part 122b. Therefore, first plating layer 145, second plating layer 146, third plating layer 147, and lower region 148 including barrier layer 141 and seed layer 142 are not provided in second opening part 122b and a periphery of second opening part 122b. Furthermore, barrier layer 141 is not in contact with a portion of first wiring 131 which is exposed through second opening part 122b. First wiring 131 has a recess part 131a recessed from an upper surface of first wiring 131 in a portion of first wiring 131 which is exposed through second opening part 122b.

Third wiring 133 and fourth wiring 134 are provided on first insulating film 121. Third wiring 133 and fourth wiring 134 are provided in parallel with first wiring 131. Second wiring 132 is formed across first wiring 131, third wiring 133, and fourth wiring 134. Second wiring 132 is not connected to third wiring 133 and fourth wiring 134 but is only connected to first wiring 131. Second insulating film 122 does not have an opening part for exposing third wiring 133 and an opening part for exposing fourth wiring 134. First wiring 131, third wiring 133, and fourth wiring 134 is, for example, an aluminum wiring. Third wiring 133 and fourth wiring 134 may not be provided.

Lower layer wiring 111 is provided on underlayer 110. Lower layer wiring 111 is, for example, an aluminum wiring. First insulating film 121 is provided to cover lower layer wiring 111. First wiring 131 is connected to lower layer wiring 111 through via 112 that penetrates through first insulating film 121.

First insulating film 121 and second insulating film 122 may be a silicon nitride (SiN) film, a tetraethoxysilane (TEOS) film, or the like. A semiconductor element such as a transistor may be provided in semiconductor substrate 101.

In a semiconductor device of the present exemplary embodiment, a portion of a wiring made of material that may oxidizes or causes migration, such as copper, is coated with a film made of stable metal such as nickel or the like. Therefore, it is possible to particularly improve reliability of a semiconductor device in which a protective film is not provided on a wiring such as a bump pad. Furthermore, it is possible to enhance strength of a bump and increase pressure-bonding force at a time of bump connection since a surface of a wiring is coated with nickel material whose hardness is higher than hardness of copper. It is also possible to further stabilize the surface of the wiring by coating gold on a layer made of nickel. Therefore, it is also possible to improve connectivity.

Figure 2A:
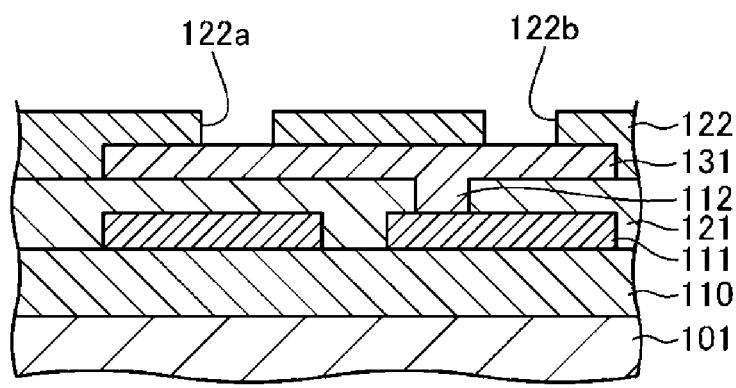
FIG. 2A is a cross-sectional view illustrating a manufacturing method of the semiconductor device according to the first exemplary embodiment.

A semiconductor device according to the first exemplary embodiment is formed as follows. First, as illustrated in FIG. 2A, lower layer wiring 111 is formed on underlayer 110 provided on semiconductor substrate 101. Subsequently, first insulating film 121 is formed on underlayer 110. Then, an opening part for exposing lower layer wiring 111 is provided in first insulating film 121. Thereafter, first wiring 131 and via 112 that connects first wiring 131 and lower layer wiring 111 are formed on first insulating film 121. Subsequently, second insulating film 122 is formed on first insulating film 121 to cover first wiring 131. Then, first opening part 122a and second opening part 122b are formed in second insulating film 122. First opening part 122a is formed in a region where second wiring 132 is to be provided and second opening part 122b is formed in a region where second wiring 132 is not to be provided.

It is preferable that a size of first opening part 122a and second opening part 122b is set such that flatness of an upper surface of second wiring 132 can be ensured. For example, a planar size of first opening part 122a and second opening part 122b may be set to approximately 5 μm square. It is preferable from a viewpoint of fillability that corners of first opening part 122a and second opening part 122b are chamfered. First opening part 122a and second opening part 122b may not be a planar square shape. Furthermore, at least either the size or the planar shape of first opening part 122a and second opening part 122b may be different.

First insulating film 121 and second insulating film 122 may be a SiN film, a TEOS film, or the like. First insulating film 121 and second insulating film 122 may be formed by a chemical vapor deposition (CVD) method or the like. Film thicknesses of first insulating film 121 and second insulating film 122 may be approximately 1 μm. Lower layer wiring 111 and first wiring 131 may be formed, after an aluminum film has been formed by a sputtering method or the like, by patterning the aluminum film by means of lithography and dry etching. Via 112 may be formed simultaneously with first wiring 131 by previously forming an opening part for exposing lower layer wiring 111 in first insulating film 121.

Figure 2B:
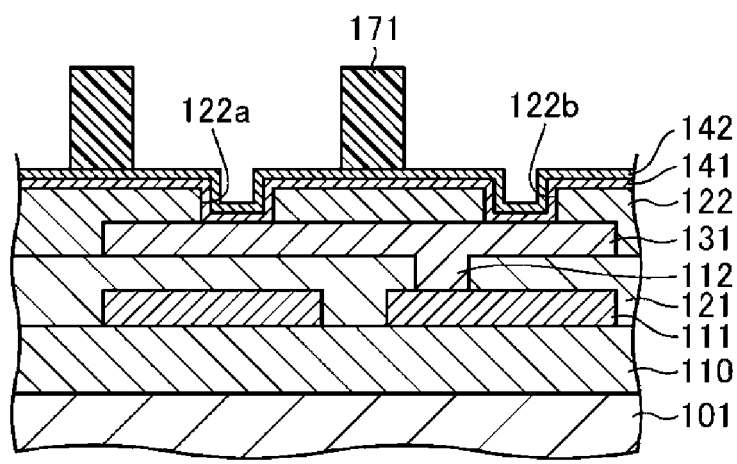
FIG. 2B is a cross-sectional view illustrating the manufacturing method of the semiconductor device according to the first exemplary embodiment.

Next, as illustrated in FIG. 2B, barrier layer 141 made of titanium and seed layer 142 made of copper are sequentially formed on an entire surface of second insulating film 122 including insides of first opening part 122a and second opening part 122b. Barrier layer 141 and seed layer 142 may be formed by a sputtering method or the like. Thicknesses of barrier layer 141 and seed layer 142 are approximately 0.2 μm, respectively. Subsequently, a resist pattern 171 is formed to surround a region where second wiring 132 is to be formed. Resist pattern 171 is formed such that a portion that eventually becomes lower region 148 is exposed in an opening part of resist pattern 171 and an outer dimension of the opening part coincides with an outer dimension of second plating layer 146. A thickness of resist pattern 171 is not particularly limited but may be approximately 1 μm.

Figure 2C:
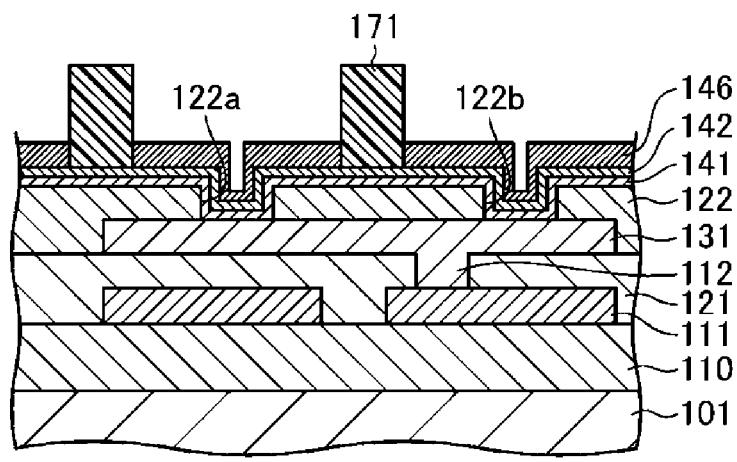
FIG. 2C is a cross-sectional view illustrating the manufacturing method of the semiconductor device according to the first exemplary embodiment.

Next, as illustrated in FIG. 2C, copper electroplating is performed to form a copper plating layer on a portion where seed layer 142 is exposed, the copper plating layer becoming second plating layer 146.

Figure 2D:
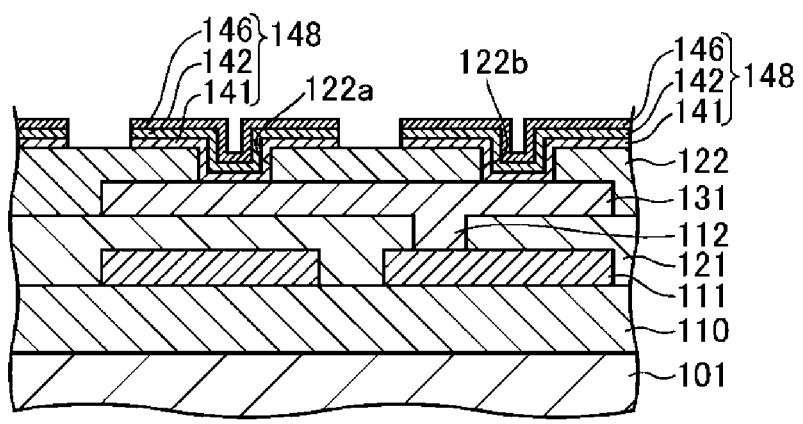
FIG. 2D is a cross-sectional view illustrating the manufacturing method of the semiconductor device according to the first exemplary embodiment.

Next, as illustrated in FIG. 2D, resist pattern 171 is removed and second plating layer 146 is etched until a thickness of second plating layer 146 becomes approximately 0.4 μm. As a result, lower region 148 constituted by barrier layer 141, seed layer 142, and second plating layer 146 is formed in a portion not covered with resist pattern 171. On the other hand, in a portion where second plating layer 146 has not been formed because due to resist pattern 171 covering, second insulating film 122 is exposed by removing seed layer 142 and barrier layer 141. Accordingly, lower region 148 formed in a periphery of first opening part 122a is separated from lower region 148 formed in a periphery of second opening part 122b.

Figure 3A:
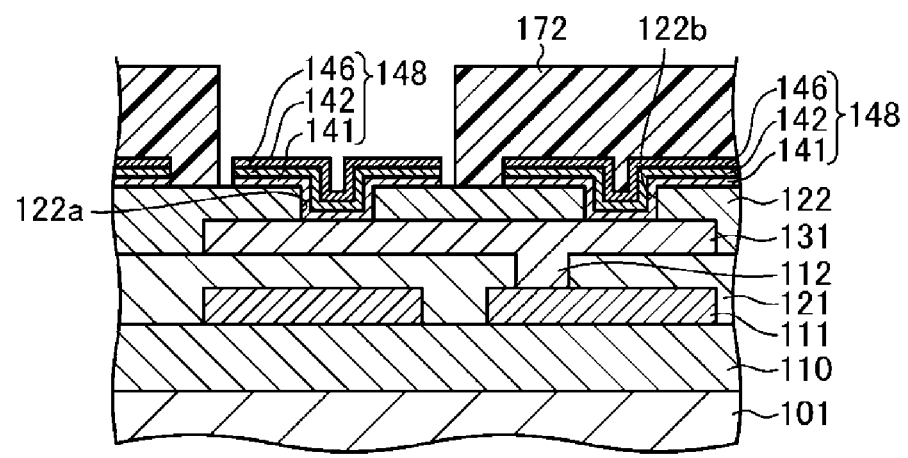
FIG. 3A is a cross-sectional view illustrating the manufacturing method of the semiconductor device according to the first exemplary embodiment.

Next, as illustrated in FIG. 3A, resist pattern 172 having an opening part that exposes a region for forming second wiring 132 is formed. The opening part of resist pattern 172 is configured to be larger than lower region 148 formed in a periphery of first opening part 122a to expose an upper surface of second insulating film 122.

Figure 3B:
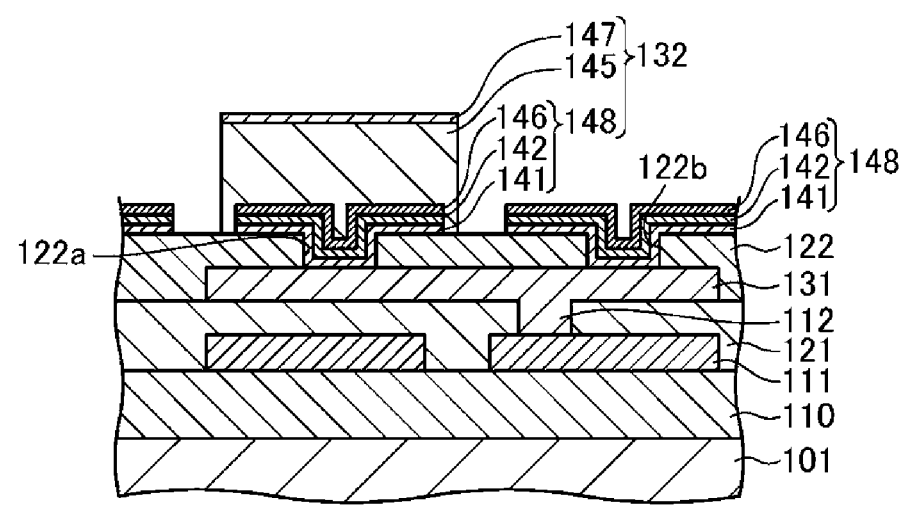
FIG. 3B is a cross-sectional view illustrating the manufacturing method of the semiconductor device according to the first exemplary embodiment.

Next, as illustrated in FIG. 3B, nickel electroplating is performed to form first plating layer 145 in the opening part of resist pattern 172. Then, gold electroplating is performed to form third plating layer 147 on first plating layer 145. A film thickness of first plating layer 145 may be approximately 10 μm. A film thickness of third plating layer 147 may be approximately 0.3 μm.

When first plating layer 145 and third plating layer 147 are formed, electrical current is provided from lower region 148 formed in a periphery of second opening part 122b. Lower region 148 formed in a periphery of first opening part 122a and lower region 148 formed in a periphery of second opening part 122b are separated but are electrically connected through first wiring 131. Therefore, first plating layer 145 may be formed to cover an upper surface and a side surface of lower region 148 formed in a periphery of first opening part 122a, and an exposed portion of second insulating film 122.

Figure 3C:
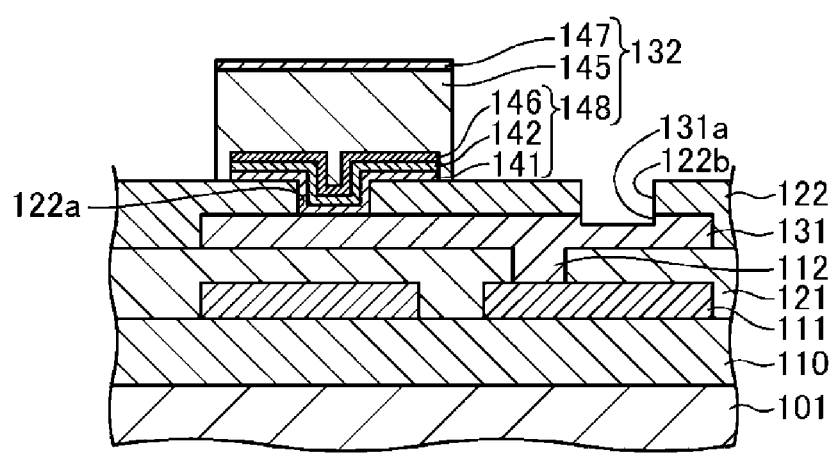
FIG. 3C is a cross-sectional view illustrating the manufacturing method of the semiconductor device according to the first exemplary embodiment.

Next, as illustrated in FIG. 3C, after resist pattern 172 has been removed, portions of second plating layer 146, seed layer 142, and barrier layer 141 other than lower region 148 of second wiring 132 are removed using overall etching or the like. At this time, a portion of first wiring 131 exposed through second opening part 122b is also etched. Thus, a recess part of first wiring 131 may be formed. Even if the recess part is formed, the semiconductor device operates without any problems.

According to a manufacturing method of the semiconductor device of the present exemplary embodiment, a semiconductor device in which oxidation, migration, or the like of a wiring made of copper is greatly reduced may be formed without substantially changing conventional semiadditive method. Therefore, it is possible to realize a reliable semiconductor device in which an occurrence of a wiring short circuit or the like is significantly reduced. Furthermore, an advantage may be obtained in which a formation position of a second wiring may be accurately set by a position of a resist pattern.

First Variation of First Exemplary Embodiment

Figure 4:
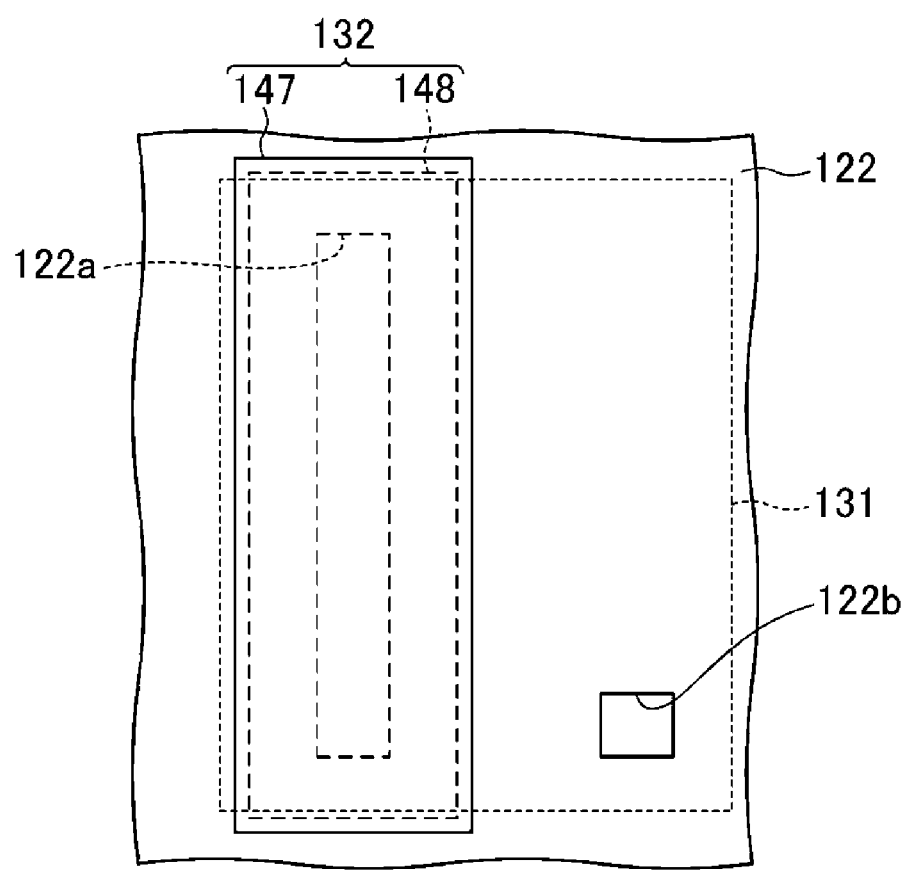
FIG. 4 is a plan view illustrating a semiconductor device according to a first variation of the first exemplary embodiment.

A first variation of the first exemplary embodiment is described with reference to FIG. 4. FIG. 4 illustrates a planar structure of a semiconductor device according to the first variation of the first exemplary embodiment.

The semiconductor device of the present variation differs from the semiconductor device of the first exemplary embodiment in that first wiring 131, on which second wiring 132 is formed, has a wide width. In this case, as illustrated in FIG. 4, first opening part 122a may have a rectangular shape to be along with a width of first wiring 131. Since a percentage of a portion that is in contact with first wiring 131 in lower region 148 is increased, it is possible to increase an amount of electrical current supplied during electroplating. This makes it possible to stably form first plating layer 145 and third plating layer 147.

A planar size of first opening part 122a is not particularly limited but may be approximately 20% of a planar size of lower region 148. A width of first opening part 122a is preferably approximately 5 μm from a viewpoint of ensuring flatness of an upper surface of second wiring 132. It is preferable from a viewpoint of fillability that corners of first opening part 122a are chamfered.

Second Variation of First Exemplary Embodiment

Figure 5:
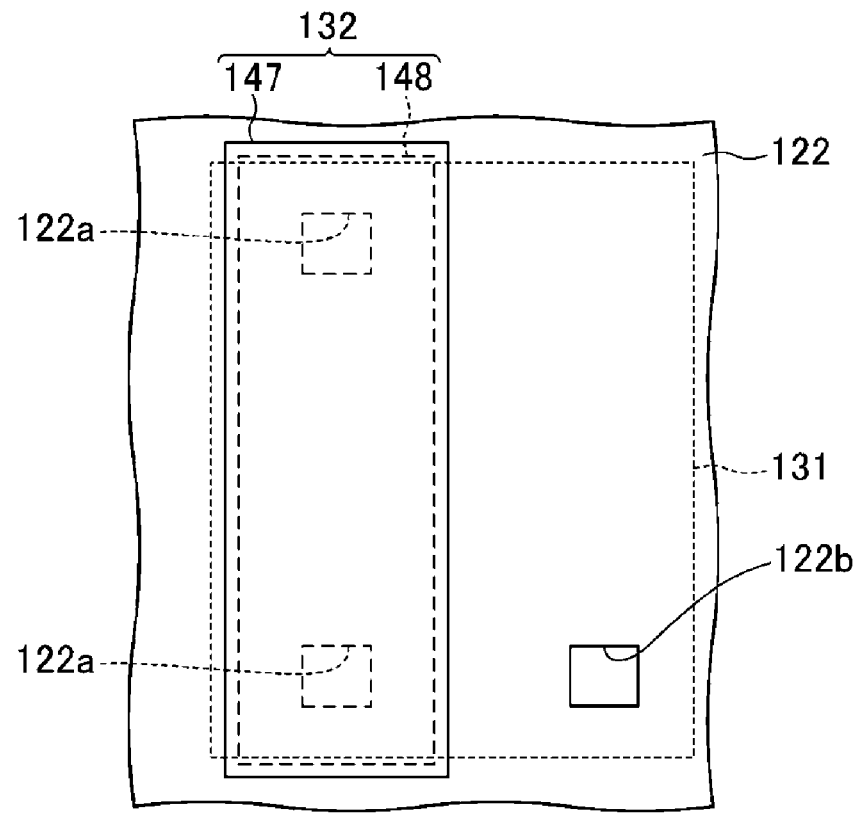
FIG. 5 is a plan view illustrating a semiconductor device according to a second variation of the first exemplary embodiment.

FIG. 5 illustrates a planar structure of a semiconductor device according to a second variation of the first exemplary embodiment. As illustrated in FIG. 5, a plurality of first opening parts 122a are provided instead of providing first opening part 122a having a rectangular shape that is along with a width of first wiring 131. Even with such a configuration, it is possible to increase an amount of electrical current supplied during electroplating since a percentage of a portion which is in contact with first wiring 131 in lower region 148 can be increased. In particular, it is possible to stably and uniformly supply electrical current over an entire region where second wiring 132 is formed by widening a distance between first opening parts 122a to some extent.

A planar size of first opening part 122a may be approximately 5 μm square from a viewpoint of ensuring flatness of the upper surface of second wiring 132. It is preferable from a viewpoint of fillability that corners of first opening part 122a are chamfered. A number of first opening parts 122a is not limited to two but three or more first opening parts 122a may be provided. When a plurality of first opening parts 122a are provided, all of first opening parts 122a do not necessarily have the same size and shape.

Third Variation of First Exemplary Embodiment

Figure 6:
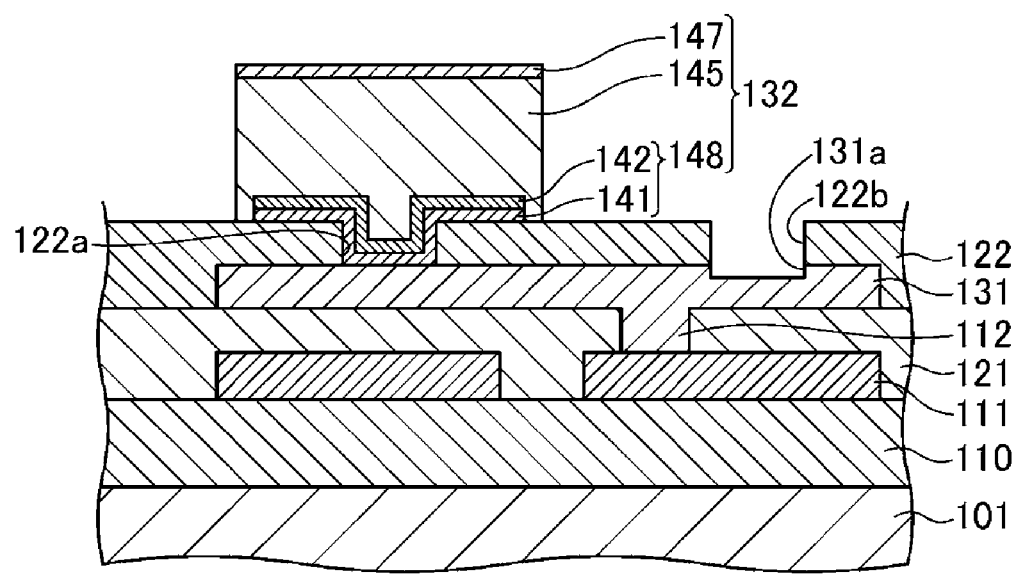
FIG. 6 is a cross-sectional view illustrating a semiconductor device according to a third variation of the first exemplary embodiment.

In the first exemplary embodiment, second plating layer 146 is provided between seed layer 142 and first plating layer 145. However, as illustrated in FIG. 6, second plating layer 146 may not be provided. A number of processes manufacturing the semiconductor device may be reduced by not providing second plating layer 146.

Figure 7A:
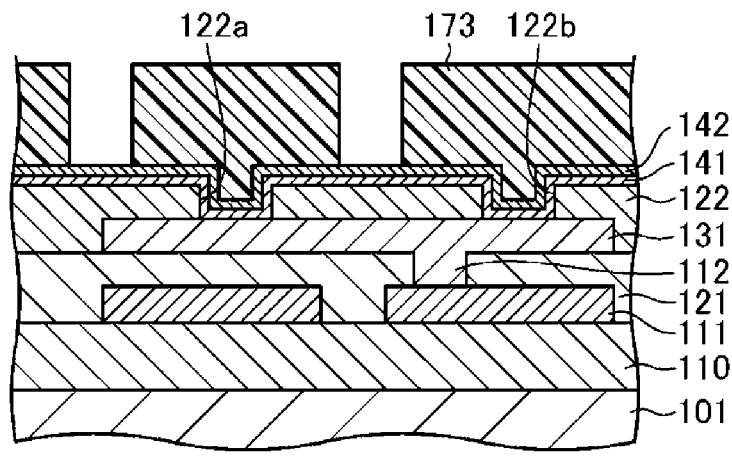
FIG. 7A is a cross-sectional view illustrating a manufacturing method of the semiconductor device according to the third variation of the first exemplary embodiment.

A semiconductor device of the present variation may be formed as follows. First, as illustrated in FIG. 7A, barrier layer 141 and seed layer 142 are formed on second insulating film 122 similarly to the first exemplary embodiment. Subsequently, resist pattern 173 is formed in which an opening part is provided to surround a portion in which lower region 148 of second wiring 132 is to be formed.

Figure 7B:
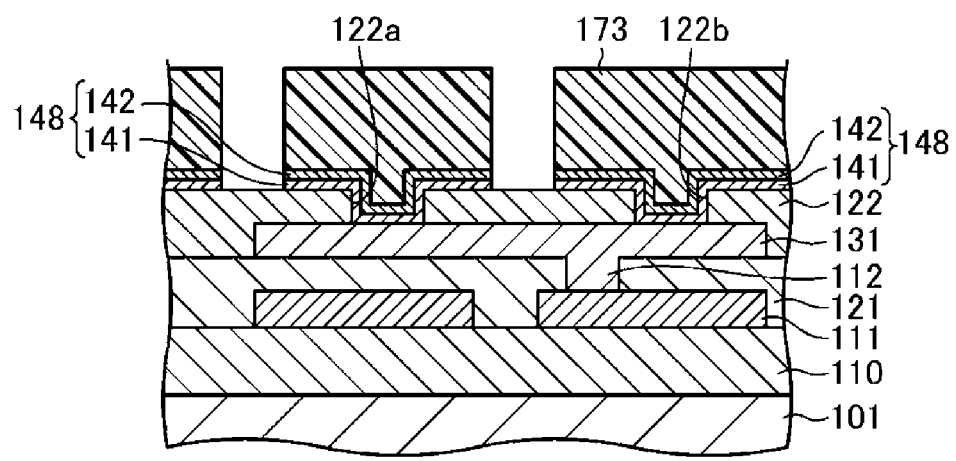
FIG. 7B is a cross-sectional view illustrating the manufacturing method of the semiconductor device according to the third variation of the first exemplary embodiment.

Next, as illustrated in FIG. 7B, seed layer 142 and barrier layer 141 are selectively removed by etching using resist pattern 173 as a mask to expose second insulating film 122. As a result, lower region 148 constituted by barrier layer 141 and seed layer 142 is formed. Lower region 148 formed in a periphery of first opening part 122a is separated from lower region 148 formed in a periphery of second opening part 122b.

Figure 7C:
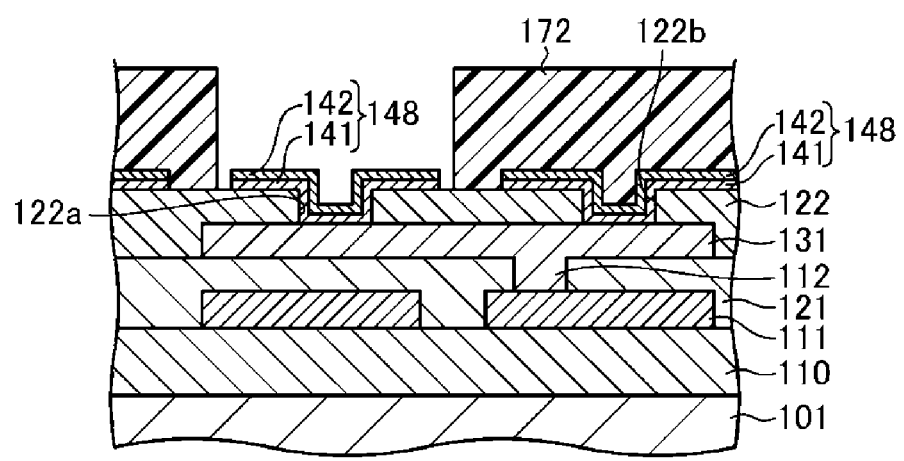
FIG. 7C is a cross-sectional view illustrating the manufacturing method of the semiconductor device according to the third variation of the first exemplary embodiment.

Next, as illustrated in FIG. 7C, after resist pattern 173 has been removed, resist pattern 172 having an opening part that exposes a region for forming second wiring 132 is formed. Similarly to the first exemplary embodiment, an opening part of resist pattern 172 is configured to be larger than lower region 148 formed in a periphery of first opening part 122a to expose an upper surface of second insulating film 122. Subsequently, similarly to the first exemplary embodiment, nickel electroplating is performed to form first plating layer 145 in the opening part of resist pattern 172.

Thereafter, similarly to the first exemplary embodiment, resist pattern 172 is removed and an unnecessary portion of seed layer 142 and barrier layer 141 is removed.

In the present variation, A number of manufacturing processes may be reduced in comparison with a number of manufacturing processes required in the first exemplary embodiment because second plating layer 146 is not formed.

The semiconductor devices of the first variation and second variation of the first exemplary embodiment may also be configured similarly to the semiconductor device of the present variation.

Second Exemplary Embodiment

Figure 8A:
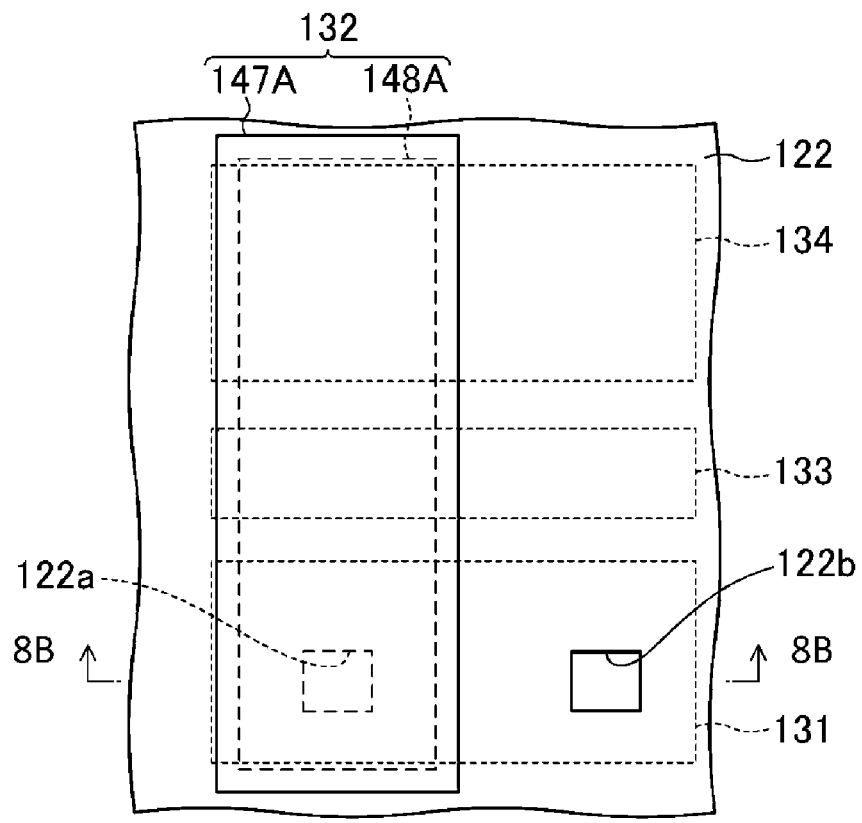
FIG. 8A is a plan view of a semiconductor device according to a second exemplary embodiment.
Figure 8B:
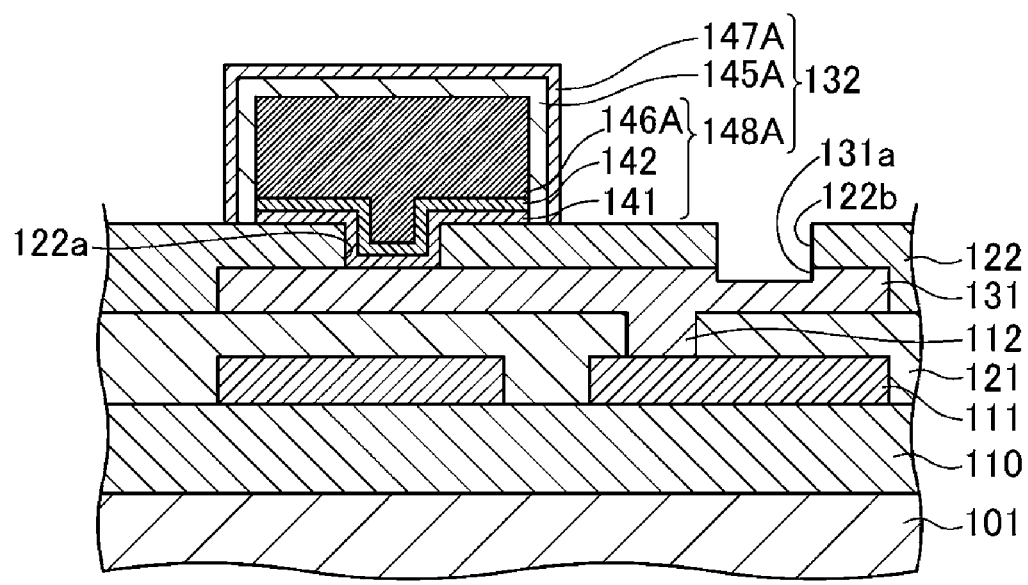
FIG. 8B is a cross-sectional view taken along line 8B-8B of the semiconductor device illustrated in FIG. 8A.

A second exemplary embodiment is described with reference to FIG. 8A and FIG. 8B. FIG. 8A and FIG. 8B illustrate a semiconductor device according to the second exemplary embodiment.

The semiconductor device of the present exemplary embodiment differs from the semiconductor device of the first exemplary embodiment in that second plating layer 146A is a thick copper plating layer, and in that first plating layer 145A is thinner than second plating layer 146A. In the following, differences from the first exemplary embodiment are mainly described.

A thickness of second plating layer 146A on second insulating film 122 except for first opening part 122a may be, for example, approximately 10 µm. Second plating layer 146A is a base layer whose mass is largest among metal layers constituting second wiring 132. Second plating layer 146A is provided to fill first opening part 122a. A planar size of second plating layer 146A is approximately the same as a planar size of barrier layer 141 and seed layer 142 similarly to the first exemplary embodiment. A side surface of lower region 148A constituted by barrier layer 141, seed layer 142, and second plating layer 146A is substantially vertical.

A thickness of first plating layer 145A may be approximately 0.4 µm. First plating layer 145A entirely covers an upper surface and a side surface of lower region 148A similarly to the first exemplary embodiment. A planar size of first plating layer 145A is larger than a planar size of lower region 148A. First plating layer 145A is in contact with second insulating film 122 outside lower region 148A.

Therefore, lower region 148A is shielded from outside by first wiring 131, second insulating film 122, and first plating layer 145A.

A thickness of third plating layer 147A may be approximately 0.3 µm. Third plating layer 147A is provided on surfaces including an upper surface and a side surface of first plating layer 145A. A planar size of third plating layer 147A is larger than a planar size of first plating layer 145A. Third plating layer 147A is in contact with second insulating film 122 outside first plating layer 145A.

In a semiconductor device of the present exemplary embodiment, a portion of second wiring 132 made of copper is coated with a film made of stable metal such as nickel similarly to the semiconductor device of the first exemplary embodiment. Therefore, reliability of a semiconductor device in which a protection film is not provided on a wiring such as a bump pad can be particularly improved. Furthermore, by increasing a thickness of the copper plating layer, it is also possible to reduce stress applied on an underlying wiring and element at a time of performing bump connection while the hardness and strength required as a bump pad are ensured. Reduction in electrical resistance can be also expected. Furthermore, an amount of use of nickel can be reduced in comparison with the first exemplary embodiment.

Figure 9A:
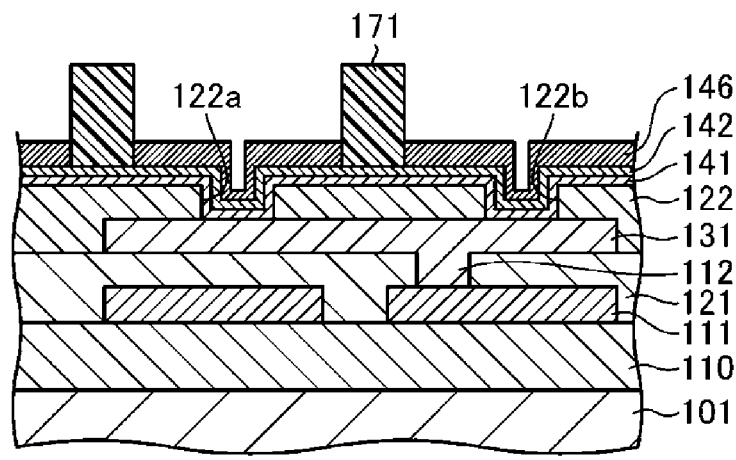
FIG. 9A is a cross-sectional view illustrating a manufacturing method of the semiconductor device according to the second exemplary embodiment.

A semiconductor device of the present exemplary embodiment may be formed as follows. First, as illustrated in FIG. 9A, processing steps similarly to the first exemplary embodiment up to the step in which second plating layer 146 is formed are performed.

Figure 9B:
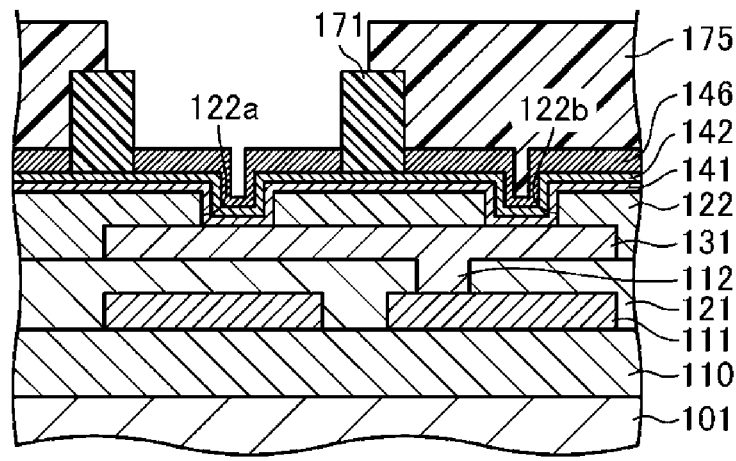
FIG. 9B is a cross-sectional view illustrating the manufacturing method of the semiconductor device according to the second exemplary embodiment.

Next, as illustrated in FIG. 9B, resist pattern 175 having an opening in a region for forming second wiring 132 is formed while resist pattern 171 is left intact.

Figure 9C:
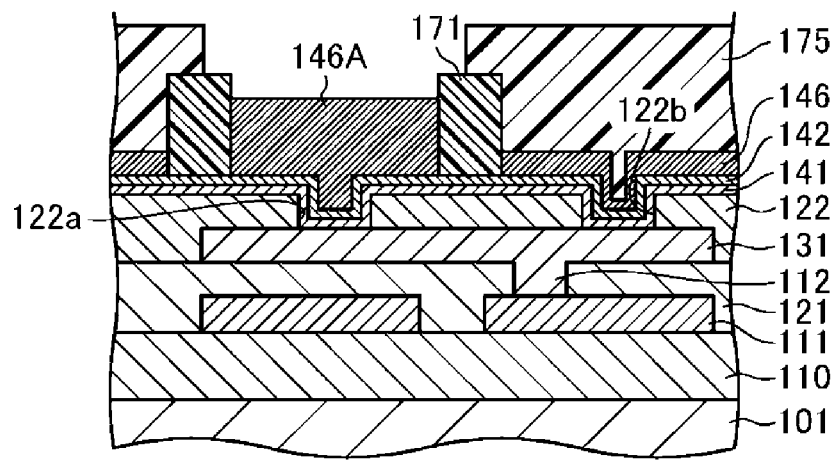
FIG. 9C is a cross-sectional view illustrating the manufacturing method of the semiconductor device according to the second exemplary embodiment.

Next, as illustrated in FIG. 9C, copper is stacked up within an opening part of resist pattern 175 by copper electroplating to form second plating layer 146A.

Figure 10A:
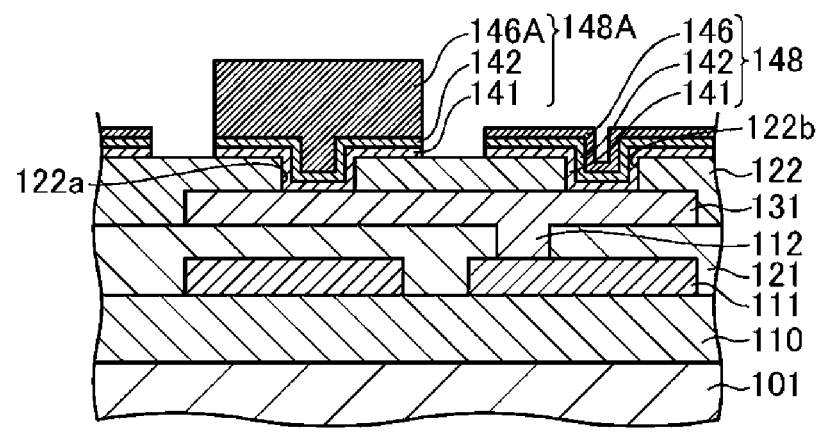
FIG. 10A is a cross-sectional view illustrating the manufacturing method of the semiconductor device according to the second exemplary embodiment.

Next, as illustrated in FIG. 10A, resist pattern 171 and resist pattern 175 are removed, and a portion of second plating layer 146 which had been covered by resist pattern 175 is etched until a thickness of the portion of second plating layer 146 becomes approximately 0.4 µm. As a result, lower region 148A having thick second plating layer 146A is formed in a portion corresponding to the opening part of resist pattern 175. Lower region 148 having thin second plating layer 146 is formed in a portion which had not been covered with resist pattern 175. In a portion which had been covered with resist pattern 171, seed layer 142 and barrier layer 141 are removed and second insulating film 122 is exposed. Therefore, lower region 148A and lower region 148 are separated.

Figure 10B:
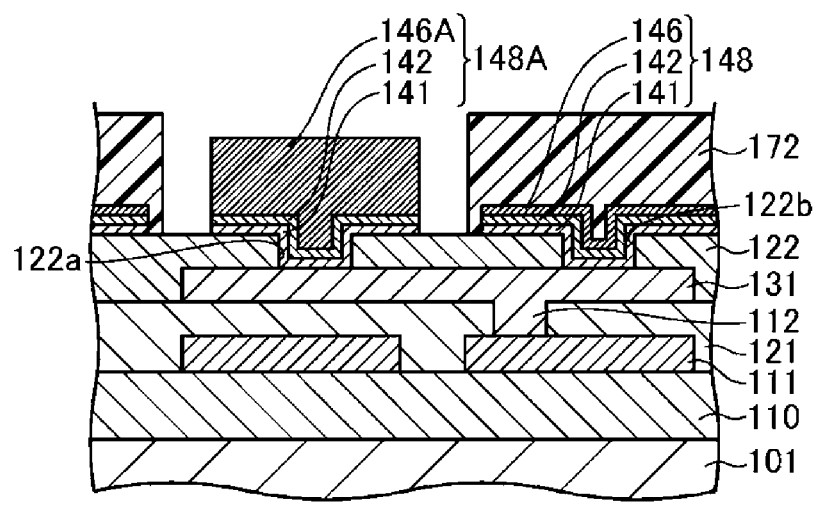
FIG. 10B is a cross-sectional view illustrating the manufacturing method of the semiconductor device according to the second exemplary embodiment.

Next, as illustrated in FIG. 10B, resist pattern 172 having an opening part that exposes a region for forming second wiring 132 is formed. An opening part of resist pattern 172 is configured to be larger than lower region 148A formed in a periphery of first opening part 122a to expose an upper surface of second insulating film 122.

Figure 10C:
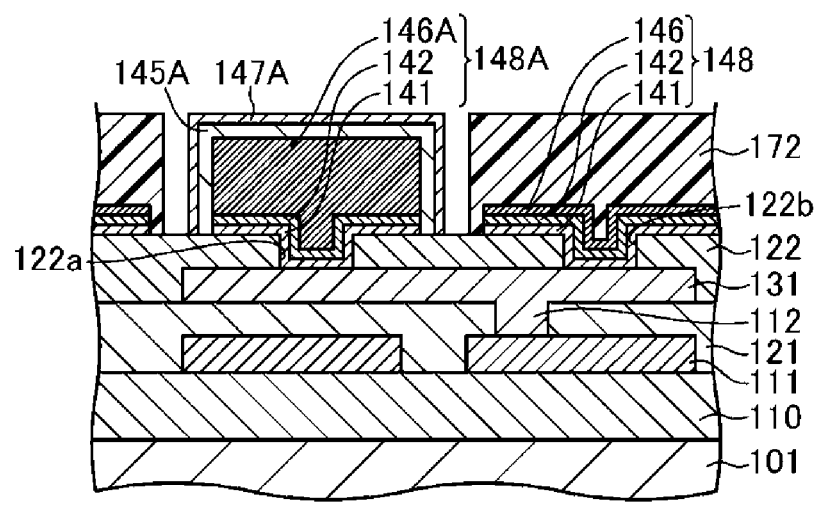
FIG. 10C is a cross-sectional view illustrating the manufacturing method of the semiconductor device according to the second exemplary embodiment.

Next, as illustrated in FIG. 10C, nickel electroplating is performed to form first plating layer 145A that covers an upper surface and a side surface of lower region 148A. Then, gold electroplating is performed to form third plating layer 147A that covers first plating layer 145A. Electrical current is supplied from lower region 148 formed in a periphery of second opening part 122b when first plating layer 145A and third plating layer 147A are formed similarly to the first exemplary embodiment.

Figure 10D:
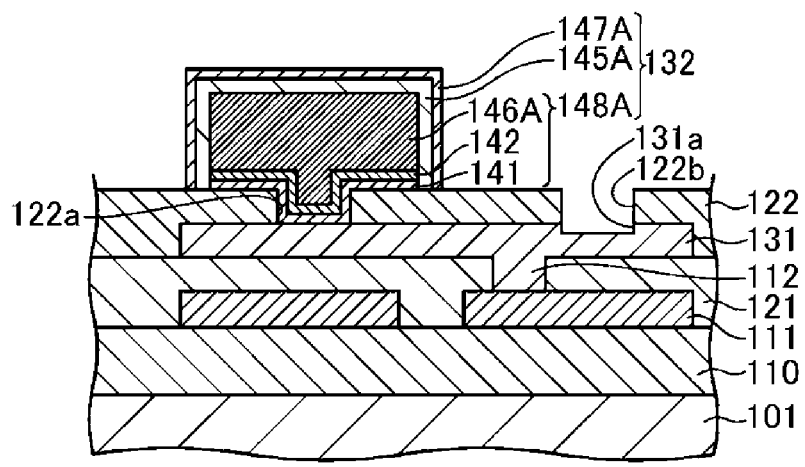
FIG. 10D is a cross-sectional view illustrating the manufacturing method of the semiconductor device according to the second exemplary embodiment.

Subsequently, as illustrated in FIG. 10D, resist pattern 172 is removed and an unnecessary portion of seed layer 142 and barrier layer 141 is removed similarly to the first exemplary embodiment.

In a manufacturing method of the semiconductor device of the present exemplary embodiment, resist pattern 171 and resist pattern 175 do not require high-precision alignment. Furthermore, since resist pattern 172 is required only to cover second plating layer 146 formed in a region other than a region for forming second wiring 132, a film thickness of resist pattern 172 may be thin. In addition, resist pattern 172 does not require high-precision alignment.

In the present exemplary embodiment, an example of forming resist pattern 175 without removing resist pattern 171 is illustrated. However, resist pattern 171 may be removed before forming resist pattern 175.

Figure 11A:
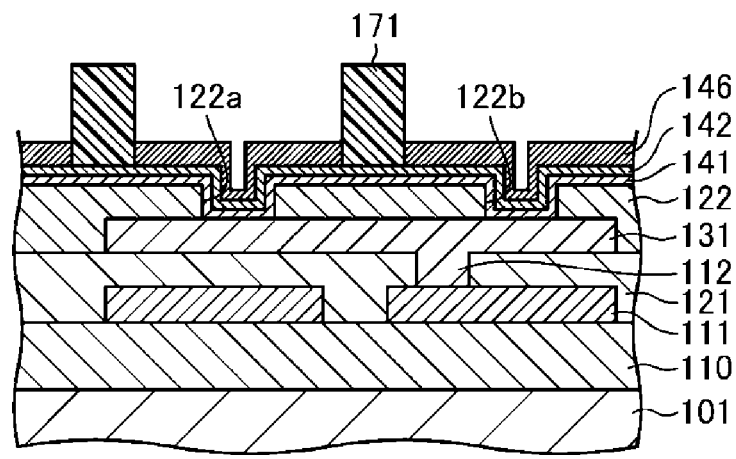
FIG. 11A is a cross-sectional view illustrating a variation of the manufacturing method of the semiconductor device according to the second exemplary embodiment.
Figure 11B:
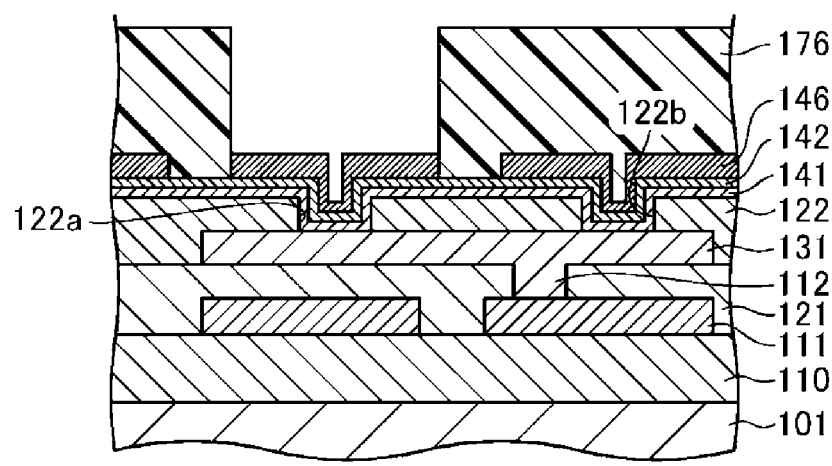
FIG. 11B is a cross-sectional view illustrating the variation of the manufacturing method of the semiconductor device according to the second exemplary embodiment.
Figure 11C:
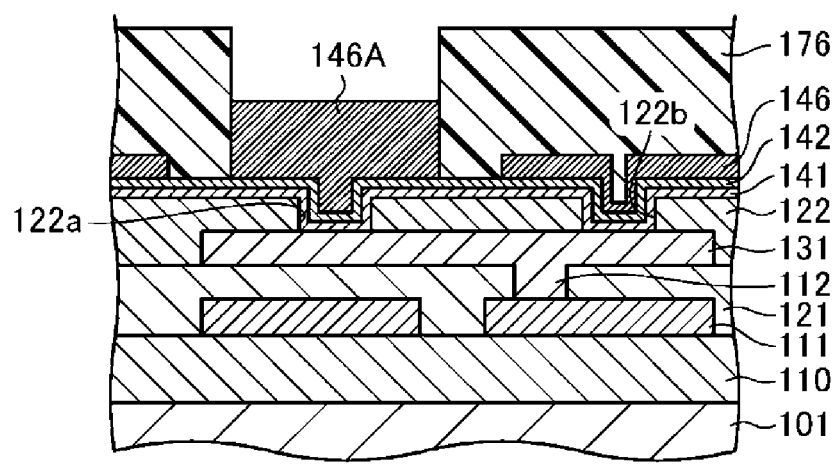
FIG. 11C is a cross-sectional view illustrating the variation of the manufacturing method of the semiconductor device according to the second exemplary embodiment.

For example, as illustrated in FIG. 11A, processing steps up to the step in which second plating layer 146 is formed are performed. Then, as illustrated in FIG. 11B, resist pattern 171 is removed and then resist pattern 176 having an opening in a region for forming second wiring 132 is formed. Subsequently, as illustrated in FIG. 11C, copper is stacked up within an opening part of resist pattern 176 by copper electroplating to form second plating layer 146A.

Thereafter, resist pattern 176 is removed and, similarly to the second exemplary embodiment, seed layer 142 and barrier layer 141 are selectively removed and first plating layer 145A and third plating layer 147A are formed by electroplating. Subsequently, an unnecessary portion of seed layer 142 and barrier layer 141 is removed.

First Variation of Second Exemplary Embodiment

In the second exemplary embodiment, an example of providing second plating layer 146A whose planar size is approximately equal to a planar size of barrier layer 141 and seed layer 142 has been illustrated. However, as illustrated in FIG. 12A to FIG. 12C, second plating layer 146B that is divided into a plurality of portions 246 separated from each other may be provided.

Figure 12A:
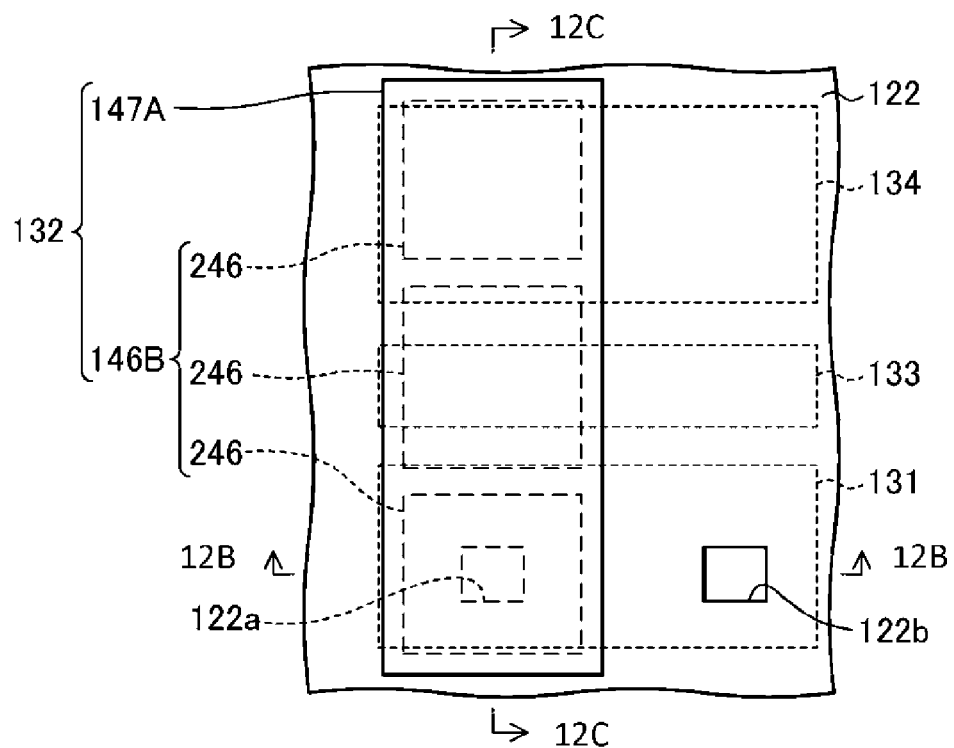
FIG. 12A is a plan view of a semiconductor device according to a first variation of the second exemplary embodiment.
Figure 12B:
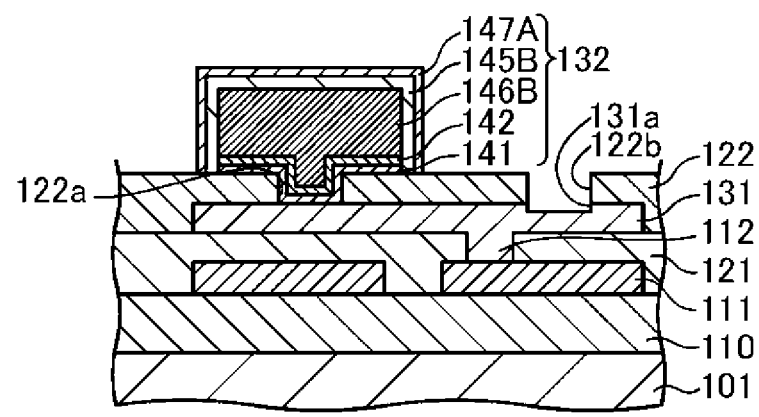
FIG. 12B is a cross-sectional view taken along line 12B-12B of the semiconductor device illustrated in FIG. 12A.
Figure 12C:
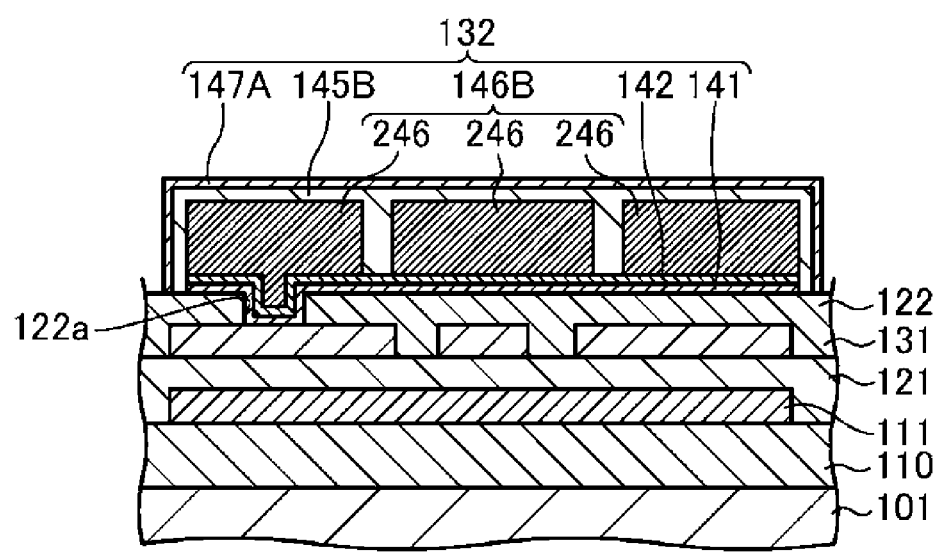
FIG. 12C is a cross-sectional view taken along line 12C-12C of the semiconductor device illustrated in FIG. 12A.

As illustrated in FIG. 12A to FIG. 12C, in a semiconductor device of the present variation, second plating layer 146B has three portions 246. In a lateral direction of second wiring 132, a width of barrier layer 141 and seed layer 142 and a width of portions 246 are approximately equal. On the other hand, in a longitudinal direction of second wiring 132, the width of portions 246 is shorter than the width of barrier layer 141 and seed layer 142. In the longitudinal direction of second wiring 132, portions 246 are arranged in a row and with an interval to each other. An upper surface and a side surface of each of portions 246 are covered with first plating layer 145B. Accordingly, portions 246 are adjacent to each other through first plating layer 145B. In a semiconductor device of the present variation, first plating layer 145B integrally covers a plurality of portions 246 of second plating layer 146B. As a result, first plating layer 145B made of nickel or the like is a lattice shape in a plan view. Accordingly, it is possible to further improve strength of second wiring 132.

A division number of second plating layer 146B is not limited to three. The number may be two or four or more. Furthermore, although an example of dividing second plating layer 146B in the longitudinal direction of second wiring 132 is illustrated, second plating layer 146B may be divided in the lateral direction of second wiring 132. In addition, second plating layer 146B may be divided in both longitudinal direction and lateral direction of second wiring 132 to dispose portions 246 in a matrix form.

By modifying a shape of resist pattern 175, a semiconductor device of the present variation may be formed similarly to the second exemplary embodiment.

Second Variation of Second Exemplary Embodiment

In the first variation, an example in which only one of portions 246 is connected to first wiring 131 through first opening part 122a is illustrated. However, as illustrated in FIG. 13A to FIG. 13C, it may be configured such that a plurality of portions 246 are connected to first wiring 131 through first opening parts 122a.

Figure 13A:
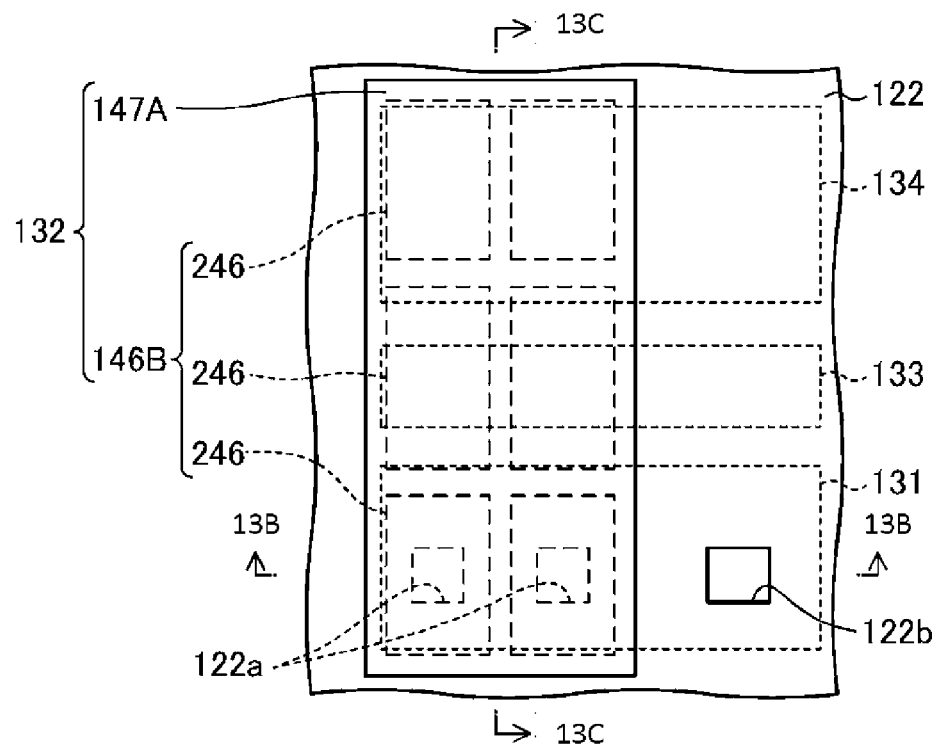
FIG. 13A is a plan view of a semiconductor device according to a second variation of the second exemplary embodiment.
Figure 13B:
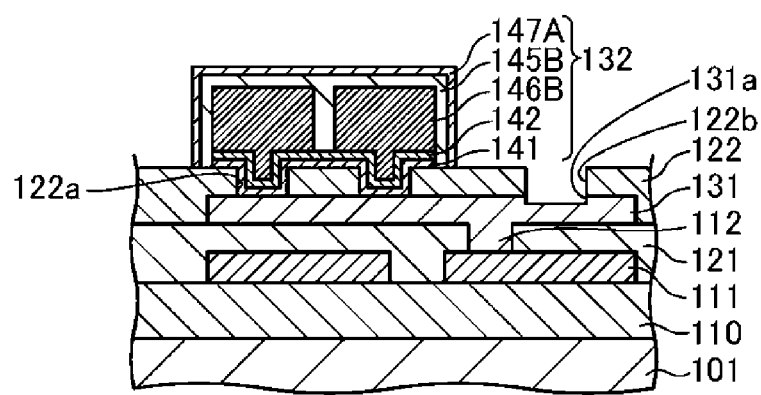
FIG. 13B is a cross-sectional view taken along line 13B-13B of the semiconductor device illustrated in FIG. 13A.
Figure 13C:
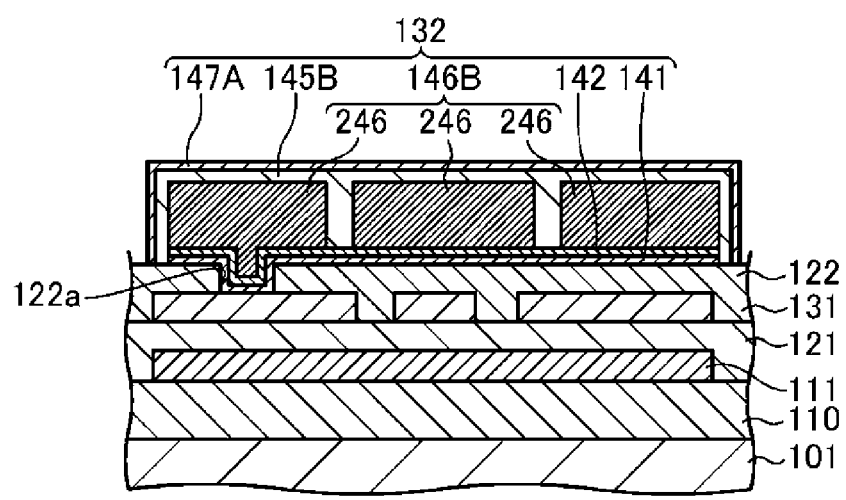
FIG. 13C is a cross-sectional view taken along line 13C-13C of the semiconductor device illustrated in FIG. 13A.

In FIG. 13A to FIG. 13C, two first opening parts 122a are provided in the lateral direction of second wiring 132. Accordingly, two portions 246 adjacent in the lateral direction of second wiring 132 are connected to first wiring 131. On the other hand, only one first opening part 122a may be provided.

A division number of second plating layer 146B is not limited to 2×3. Second plating layer 146B may be divided into a matrix form obtained by dividing by an arbitrary number in both longitudinal and lateral directions. A number of first opening parts 122a is also not limited to two. A number of first opening parts 122a may be provided in accordance with a division number of second plating layer 146B.

In a semiconductor device of the second exemplary embodiment and the variations of the second exemplary embodiment, first opening part 122a of such as the first variation and the second variation of the first exemplary embodiment may also be provided, depending on a shape of first wiring 131. In the second variation of the second exemplary embodiment, one portion 246 may correspond to a plurality of first opening parts 122a.

Third Exemplary Embodiment

Figure 14:
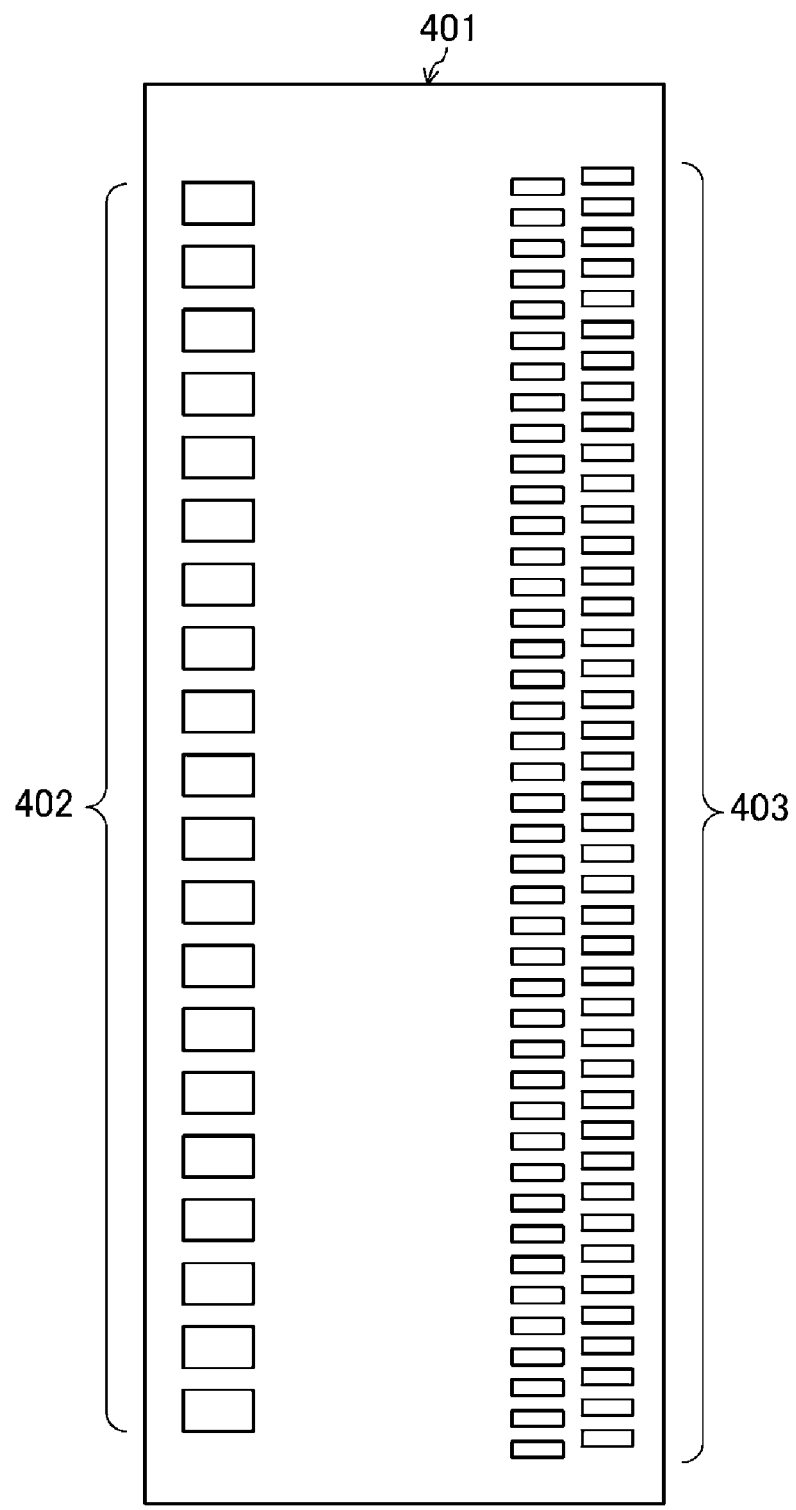
FIG. 14 is a plan view of a semiconductor device according to a third exemplary embodiment.

A third exemplary embodiment is described with reference to FIG. 14. FIG. 14 illustrates a semiconductor device according to the third exemplary embodiment. As illustrated in FIG. 14, in device chip 401, bump pad group 402 for inputs and control signals is disposed on a left side and bump pad group 403 for outputs is disposed on a right side. A size of each bump pad of bump pad group 402 on the left side is relatively large compared with a size of each bump pad of bump pad group 403 on the right side. Thus, as in a case of the second variation of the second exemplary embodiment, each bump pad of bump pad group 402 may be configured to be a bump pad whose strength is improved by dividing a copper plating layer that becomes a base of a second wiring into a plurality of portions in a matrix form and by making nickel plating layer a lattice shape in a plan view.

Each bump pad of bump pad group 403 on the right side is smaller than each bump pad of bump pad group 402, and spacing between each pair of adjacent bump pads of bump pad group 403 is also narrower than spacing between each pair of adjacent bump pads of bump pad group 402. Therefore, it is possible to perform electroplating of a nickel plating layer and a gold plating layer by forming an opening part for a plurality of portions of a copper plating layer in a resist pattern, instead of forming an opening part for each portion of the copper plating layer in a resist pattern.

With such a structure, it is possible to construct a structure having an improved strength of a bump pad (second wiring) and also to take a balance between bump pad groups 402 and 403 having bump pads with different sizes and different arrangements.

A semiconductor device of the present disclosure is provided with a wiring having sufficient oxidation resistance and migration resistance and is useful as a semiconductor device or the like having a bump pad or the like. The semiconductor device is particularly useful as a semiconductor device or the like having a wiring with a fine line/space pattern, the wiring being made of a thick film.

What is claimed is:

1. A semiconductor device comprising:
    a first insulating film formed on a semiconductor substrate;
    a first wiring formed on the first insulating film;
    a second insulating film provided on the first insulating film to cover the first wiring; and
    a second wiring formed on the second insulating film, wherein:
    the second insulating film has a first opening part and a second opening part which expose the first wiring,
    the second wiring has a seed layer provided in the first opening part and in a periphery of the first opening part, and a first plating layer provided on the seed layer,
    the first plating layer covers an upper surface and a side surface of the seed layer,
    a lower surface of the first plating layer is in direct contact with an upper surface of the second insulating film in entire circumference outside the seed layer, and
    the seed layer is not provided in the second opening part and in a periphery of the second opening part.

2. The semiconductor device according to claim 1, wherein the seed layer is made of a first metal and
    the first plating layer is made of a second metal whose hardness is higher than hardness of the first metal.

3. The semiconductor device according to claim 2, wherein the first metal is copper, and the second metal is nickel.

4. The semiconductor device according to claim 1, further comprising a second plating layer provided between the seed layer and the first plating layer,
    wherein the first plating layer covers an upper surface and an entire side surface of the second plating layer.

5. The semiconductor device according to claim 4, wherein the second plating layer is a base layer of the second wiring.

6. The semiconductor device according to claim 4, wherein a plurality of the first opening parts are provided, the second plating layer has a plurality of portions each provided corresponding to a different one of the plurality of the first opening parts and separated from each other, and
    the first plating layer integrally covers the plurality of portions of the second plating layer.

7. The semiconductor device according to claim 6, wherein the plurality of portions of the second plating layer are arranged in one row.

8. The semiconductor device according to claim 6, wherein the plurality of portions of the second plating layer are arranged in a matrix form.

9. The semiconductor device according to claim 1, wherein the first plating layer is a base layer of the second wiring.

10. The semiconductor device according to claim 9, wherein a plurality of the first opening parts are provided.

11. The semiconductor device according to claim 1, wherein the first opening part has a planar rectangular shape.

12. The semiconductor device according to claim 1, further comprising a third wiring provided on the first insulating film and adjacent to the first wiring,
    wherein the second wiring is formed across the first wiring and the third wiring.

13. The semiconductor device according to claim 1, wherein the second wiring has a third plating layer provided on the first plating layer.

14. The semiconductor device according to claim 1, wherein the first wring has a recess part in a portion exposed through the second opening part.

15. The semiconductor device according to claim 1, wherein the second wiring is a bump pad.

16. The semiconductor device according to claim 1, further comprising a barrier layer between the seed layer and the first wiring in the first opening part.

17. The semiconductor device according to claim 16, wherein a position of a side edge of the seed layer coincides with a position of a side edge of the barrier layer.

* * * * *